(12) United States Patent
Hirano

(10) Patent No.: US 12,126,272 B2
(45) Date of Patent: Oct. 22, 2024

(54) POWER SUPPLY DEVICE AND IMAGE FORMING APPARATUS

(71) Applicant: CANON KABUSHIKI KAISHA, Tokyo (JP)

(72) Inventor: Yuya Hirano, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 176 days.

(21) Appl. No.: 17/718,562

(22) Filed: Apr. 12, 2022

(65) Prior Publication Data

US 2022/0368806 A1 Nov. 17, 2022

(30) Foreign Application Priority Data

May 12, 2021 (JP) ................................. 2021-080817

(51) Int. Cl.
*H02M 1/00* (2007.01)
*H02M 1/34* (2007.01)
(Continued)

(52) U.S. Cl.
CPC ......... *H02M 7/043* (2013.01); *H02M 1/0029* (2021.05); *H02M 1/0054* (2021.05);
(Continued)

(58) Field of Classification Search
CPC ............. H02M 1/0029; H02M 1/0048; H02M 1/0054; H02M 1/34; H02M 1/342;
(Continued)

(56) References Cited

U.S. PATENT DOCUMENTS 5,506,539 A * 4/1996 Kelly ............... H03K 17/04123
327/427
6,473,318 B1 * 10/2002 Qian ................. H02M 3/33569
363/21.16
(Continued)

FOREIGN PATENT DOCUMENTS

EP 0631390 A2 * 12/1994 ............. H01L 27/04
JP 2000-092834 A 3/2000
(Continued)

OTHER PUBLICATIONS

European Search Report issued Sep. 15, 2022 in corresponding EP Application No. 22166876.

*Primary Examiner* — Thienvu V Tran
*Assistant Examiner* — Shahzeb K Ahmad
(74) *Attorney, Agent, or Firm* — VENABLE LLP

(57) ABSTRACT

A power supply device includes a transformer including a primary winding, a secondary winding and an auxiliary winding, first, second and third circuits, and a switch. The first circuit in which a first capacitor and a first rectifier are connected in series is connected to the primary winding in parallel. The switch of which one end is connected to one end of the primary winding. The second circuit in which the auxiliary winding and a second rectifier are connected in serial is connected between a connecting point, to which the first capacitor and the first rectifier are connected, and the other end of the switch. The third circuit including a resistor and a third rectifier is connected to a gate of the switch. In the third circuit, a resistance value in a direction where a current flows into the gate of the switch is smaller than that in a direction where the current flows out of the gate.

12 Claims, 5 Drawing Sheets

(51) Int. Cl.
*H02M 3/335* (2006.01)
*H02M 7/04* (2006.01)
*H03K 17/16* (2006.01)

(52) U.S. Cl.
CPC ........... *H02M 1/346* (2021.05); *H02M 3/335* (2013.01); *H02M 7/05* (2021.05); *H03K 17/163* (2013.01); *Y02B 70/10* (2013.01)

(58) Field of Classification Search
CPC ...... H02M 1/344; H02M 1/346; H02M 1/348; H02M 1/42; H02M 1/4208; H02M 1/44; H02M 3/335; H02M 3/33507; H02M 3/33523; H02M 7/06; H02M 7/043; H02M 7/05; H03K 17/0412; H03K 17/08128; H03K 17/163; H03K 17/74; H01L 27/0652; H01L 27/0716; H01L 29/7397
See application file for complete search history.

(56) References Cited

U.S. PATENT DOCUMENTS

| | | | |
|---|---|---|---|
| 10,536,085 B2 | 1/2020 | Hirano | |
| 11,079,832 B2 | 8/2021 | Hirano | |
| 2005/0117371 A1* | 6/2005 | Imamura | H02M 1/4258 363/20 |
| 2011/0292693 A1* | 12/2011 | Niijima | H02M 3/33507 363/21.17 |
| 2018/0146109 A1* | 5/2018 | Kobayashi | H04N 1/00907 |
| 2021/0325812 A1 | 10/2021 | Hirano | |

FOREIGN PATENT DOCUMENTS

| | | | | |
|---|---|---|---|---|
| JP | 2003070249 A | * | 3/2003 | ............ H02M 1/34 |
| JP | 2016-152672 A | | 8/2016 | |
| JP | 2017-112465 A | | 6/2017 | |
| JP | 2021-69254 A | | 4/2021 | |
| WO | WO-0033380 A1 | * | 6/2000 | ......... H01L 27/0652 |
| WO | 02/41482 A2 | | 5/2002 | |

* cited by examiner (a)

(b)

(c)

POWER SUPPLY DEVICE AND IMAGE FORMING APPARATUS

FIELD OF THE INVENTION AND RELATED ART

The present invention relates to a power supply device and an image forming apparatus, for example, a power supply device that reduces both electric power loss and noise.

In a switching power supply device that uses a switching element, a surge voltage is generated during turn-off of the switching element due to the leakage inductance of the transformer, the output capacity of the switching element itself, and the peak current immediately before turn-off. To suppress this surge voltage, a method has been proposed to achieve high conversion efficiency and high suppression of surge voltage by means of a clamp circuit consisting of a clamping capacitor and two diodes and transformer auxiliary windings (see, for example, U.S. Pat. No. 6,473,318).

However, in the conventional method, the current discharged from a clamping capacitor flows to the switching element immediately after the switching element turn-on. Therefore, the current immediately after the turn-on of the switching element is larger than in a typical flyback converter configuration. Therefore, the electric power loss, which is calculated as the multiplication of the current flowing into the switching element and the voltage applied to the switching element, also increases, resulting in an increase in the electric power loss generated in the switching element during turn-on.

Therefore, there is a need to reduce both the electric power loss and noise in power supply devices.

SUMMARY OF THE INVENTION

The present invention was developed under these circumstances, and aims to achieve both reduction of electric power loss and noise reduction in power supply devices.

The present invention, in order to solve the above-mentioned issue, is provided with the following configuration.

According to an aspect of the present invention, there is provided a power supply device comprising a transformer including a primary winding, a secondary winding and an auxiliary winding; a first circuit in which a first capacitor and a first rectifying element are connected in series, said first circuit being connected to said primary winding in parallel; a switching element of which one end is connected to one end of said primary winding and configured to be switched between an ON state and an OFF state; a second circuit in which said auxiliary winding and a second rectifying element are connected in serial, said second circuit being connected between a connecting point, to which said first capacitor and said first rectifying element are connected, and the other end of said switching element; and a third circuit including at least one resistor and a third rectifying element, and connected to a gate terminal of said switching element, wherein, in said third circuit, a resistance value in a direction where a current flows into said gate terminal of said switching element is smaller than a resistance value in a direction where the current flows out of said gate terminal.

According to another aspect of the present invention, there is provide an image forming apparatus comprising: an image forming unit configured to form an image onto a recording material; and a power supply device configured to supply electric power to said image forming unit, said power supply device including, a transformer including a primary winding, a secondary winding and an auxiliary winding; a first circuit in which a first capacitor and a first rectifying element are connected in series, said first circuit being connected to said primary winding in parallel; a switching element of which one end is connected to one end of said primary winding and configured to be switched between an ON state and an OFF state; a second circuit in which said auxiliary winding and a second rectifying element are connected in serial, said second circuit being connected between a connecting point, to which said first capacitor and said first rectifying element are connected, and the other end of said switching element; and a third circuit including at least one resistor and a third rectifying element, and connected to a gate terminal of said switching element, wherein, in said third circuit, a resistance value in a direction where a current flows into said gate terminal of said switching element is smaller than a resistance value in a direction where the current flows out of said gate terminal.

Further features of the present invention will become apparent from the following description of exemplary embodiments (with reference to the attached drawings).

DESCRIPTION OF THE EMBODIMENTS

The following is a description of an embodiment of the present invention with reference to the drawings.

Embodiment 1

[Image Forming Apparatus]

Figure 1:
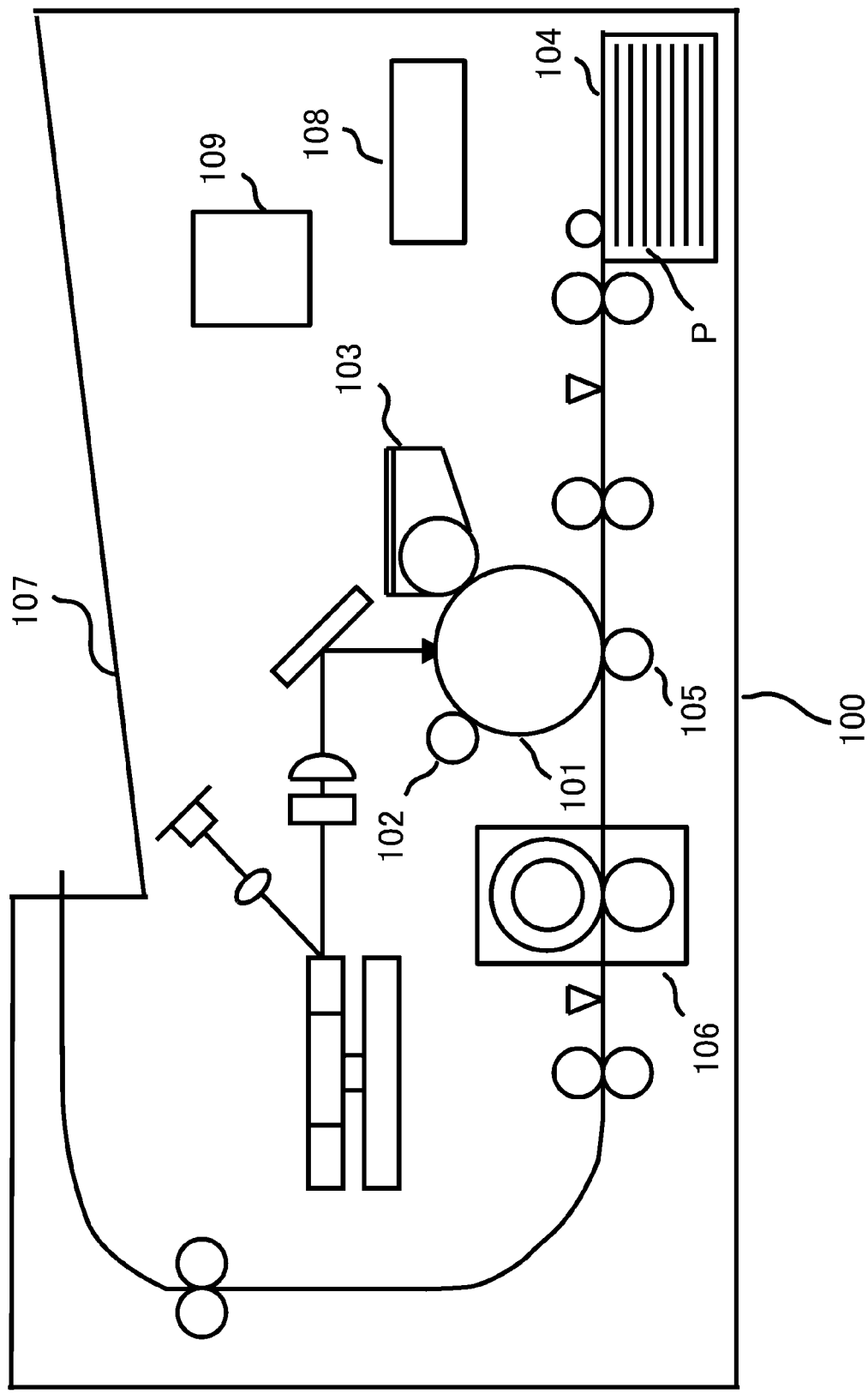
FIG. 1 is a drawing showing a schematic configuration of an image forming apparatus according to embodiments 1 and 2.

FIG. 1 shows an example of a schematic configuration of an image forming apparatus. A laser beam printer 100 (hereinafter referred to as "printer 100") includes a photosensitive drum 101, a charging portion 102, and a developing portion 103. The photosensitive drum 101 is an image bearing member on which an electrostatic latent image is formed. The charging portion 102 uniformly charges the photosensitive drum 101. The developing portion 103 develops the electrostatic latent image formed on the photosensitive drum 101 using toner to form a toner image. The toner image formed on the photosensitive drum 101 (on the image bearing member) is transferred by the transfer portion 105 to a sheet P as a recording material supplied from a cassette 104, and the unfixed toner image on the sheet P is transferred to the sheet P by a fixing device 106. The photosensitive drum 101, the charging portion 102, the developing portion 103, and the transfer portion 105 constitute the image forming unit. A fixed sheet P is discharged to a tray 107. The printer 100 also includes a power supply device 108, and electric power is supplied from the power supply device 108 to driving portions such as a motor and a control portion 109. The control portion 109 includes a CPU (not shown) and controls the image forming operation by the image forming portion and the sheet P feeding operation. The image forming apparatus to which a power supply device of the present invention can be applied is not limited to the configuration shown in FIG. 1.

[Power Supply Device]

Figure 2:
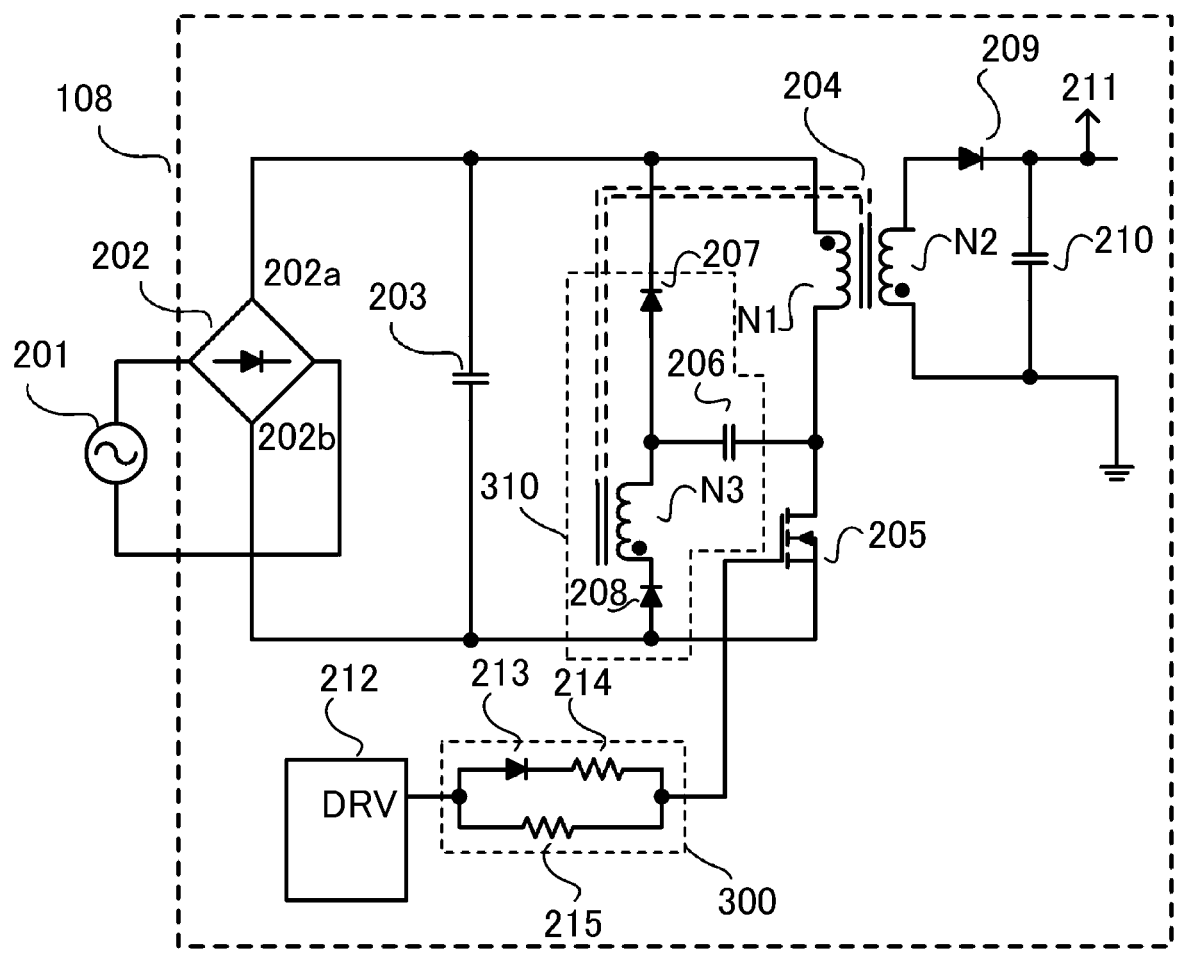
FIG. 2, part (a), part (b) and part (c), is a drawing showing the circuit configuration of a power supply device according to the embodiment 1.
Figure 2:
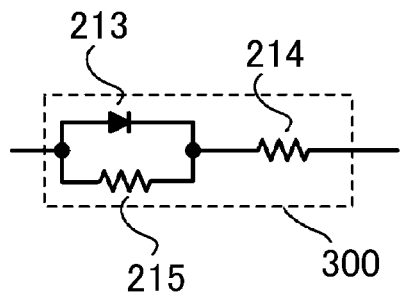
Figure 2:
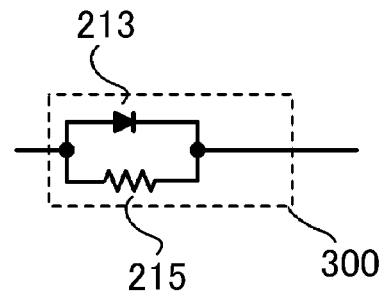

Part (a) of FIG. 2 shows the circuit configuration of the power supply device 108 according to the embodiment 1. AC voltage input from an AC power supply 201 is input to the power supply device 108 of the printer 100. The AC voltage input to the power supply device 108 is full-wave rectified through a bridge diode 202, which is a rectifying circuit, and smoothed to DC voltage by a primary filter capacitor 203, which is a second capacitor connected in parallel between two output terminals 202a and 202b. The DC voltage charged in the primary filter capacitor 203 is applied to a field effect transistor (hereinafter referred to as FET) 205, which is a switching element, through a primary winding N1 of a transformer 204. The primary winding N1 of the transformer 204 and FET 205 are connected in serial to form a serial circuit. A power supply IC212, which is a control portion, includes a DRV terminal, which is a control terminal. The power supply IC212 outputs drive pulses from the DRV terminal to the gate terminal of FET 205 through a diode 213, which is the third rectifying element, a resistor 214, which is the primary resistor, and a resistor 215, which is the secondary resistor, to switch FET 205 to the ON state or OFF state.

Here, the circuit in which the diode 213 and the resistor 214 are connected in serial and the resistor 215 are connected in parallel. The diode 213, the resistor 214, and the resistor 215 constitute the gate drive circuit 300, which is a third circuit. In the diode 213, the anode terminal is connected to the DRV terminal and the cathode terminal is connected to one end of the resistor 214. The other end of the resistor 214 is connected to the gate terminal, and the resistor 215 is connected to the DRV terminal at one end and to the gate terminal at the other end. The resistance value $R_{214}$ of the resistor 214 in the direction that current flows into the gate terminal of FET 205 is smaller than the resistance value $R_{215}$ in the direction that current flows out of the gate terminal ($R_{214}<R_{215}$). In other words, the resistance value $R_{215}$ of the resistor 215 is greater than the resistance value $R_{214}$ of the resistor 214.

The energy stored in the transformer 204 during turn-on of FET 205 is rectified by the diode 209 and the capacitor 210 via the secondary winding N2 of the transformer 204 during turn-off of FET 205 to generate a DC voltage 211. An auxiliary winding N3 coupled with the primary winding N1 and the secondary winding N2 of the transformer 204 forms a snubber circuit 310 in combination with a clamp capacitor 206 which is a first capacitor, a diode 207 which is a first rectifying element, and a diode 208 which is a second rectifying element. The diode 207 and the clamp capacitor 206 are connected in serial to form the first circuit. In addition, the diode 208 and the auxiliary winding N3 are connected in serial to form the second circuit. The snubber circuit 310 suppresses the surge voltage at the turn-off of FET 205.

[Operating Waveform of Power Supply Device]

Figure 3:
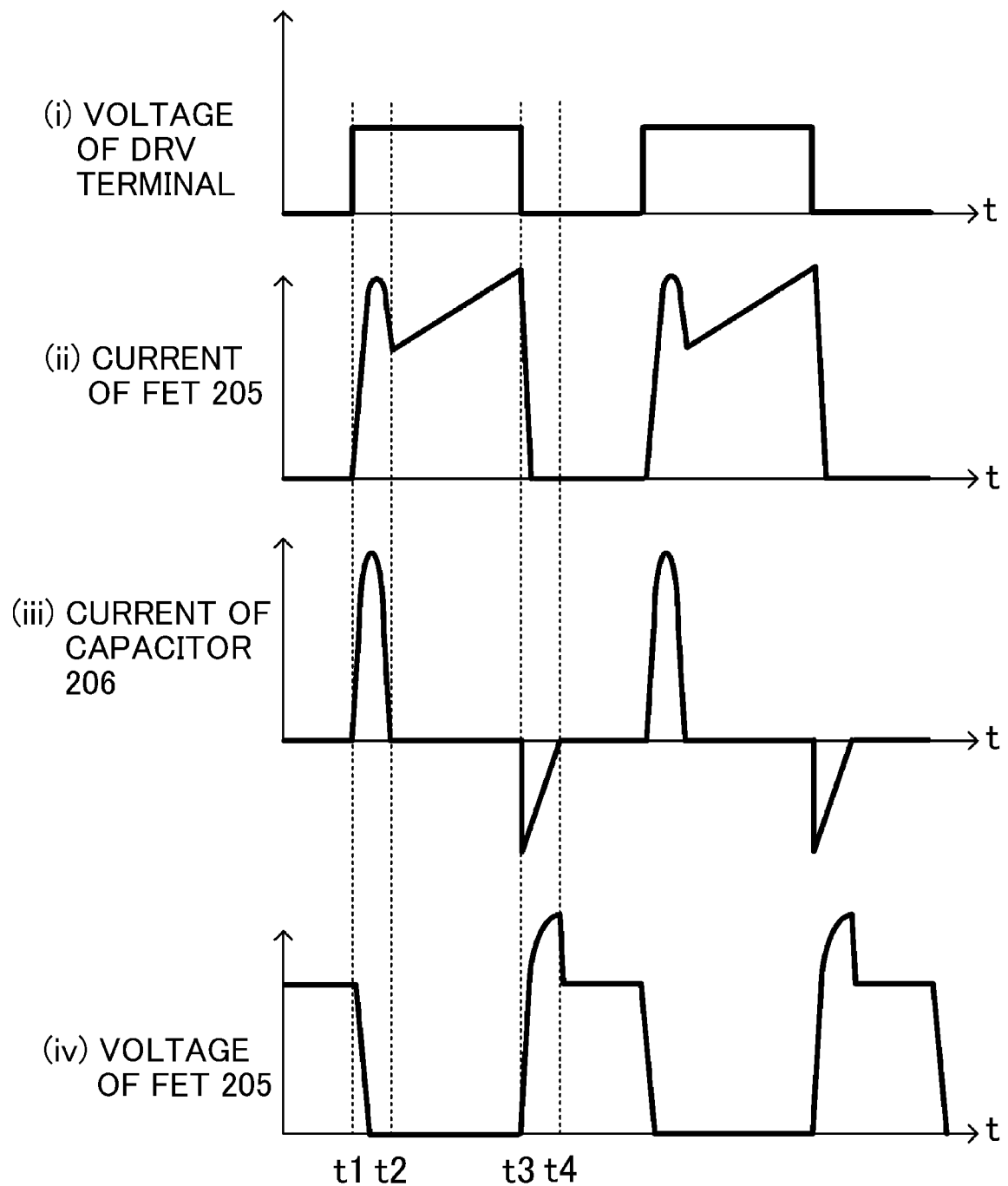
FIG. 3, part (i), part (ii), part (iii) and part (iv), is a graph showing switching waveforms of a power supply device according to the embodiment 1.

FIG. 3 shows waveforms of each of the typical switching operations of the power supply device 108 according to the embodiment 1. Part (i) of FIG. 3 shows the voltage (high level and low level) at the DRV terminal of the power supply IC212, and part (ii) shows the current flowing in FET 205. Part (iii) shows the currents in the clamp capacitor 206 (charge current (negative) and discharge current (positive)), and part (iv) shows the voltage at the drain terminal of FET 205. In both cases, the horizontal axis indicates time t, and t1, t2, etc. on the horizontal axis indicate time (timing).

At the time t1, when the DRV terminal reaches a high level, the gate current flows from the DRV terminal to the gate terminal of FET 205 via the diode 213, the resistor 214, and the resistor 215. FET 205 then turns on with a time constant determined by the gate current and the parasitic capacity including the gate capacity of FET 205. When FET 205 turns on, the DC voltage charged in the primary filter capacitor 203 is applied to the primary winding N1, and a current flows via the primary winding N1 to FET 205. Along with this, the energy stored in the clamping capacitor 206 at the previous turn-off flows through the auxiliary winding N3 and the diode 208 to FET 205 as a discharge current. At the time t2, when the discharge current in the clamping capacitor 206 reaches zero, the diode 208 is de-energized and FET 205 receives a current from the primary filter capacitor 203 only through the primary winding N1.

At the time t3, when the DRV terminal becomes low level, a gate current flows from the gate terminal of FET 205 to the DRV terminal via the resistor 215. FET 205 then turns off with a time constant determined by the gate current and the parasitic capacity of FET 205. When FET 205 turns off, the leakage inductance component of the transformer 204, the clamp capacitor 206, and the diode 207 form a resonant circuit, and a resonant current flows in the clamp capacitor 206. This resonant circuit acts as a snubber circuit 310 and suppresses the generation of surge voltage at the drain terminal of FET 205.

At the time t4, when the resonant current to the clamp capacitor 206 reaches zero, the diode 207 becomes non-conductive. The drain terminal voltage of FET 205 is the DC voltage charged to the primary filter capacitor 203, plus the DC voltage 211 multiplied by the ratio of the number of turns of the primary winding N1 to the number of turns of the secondary winding N2 (turn ratio).

[Waveform at Turn-on of FET]

Figure 4:
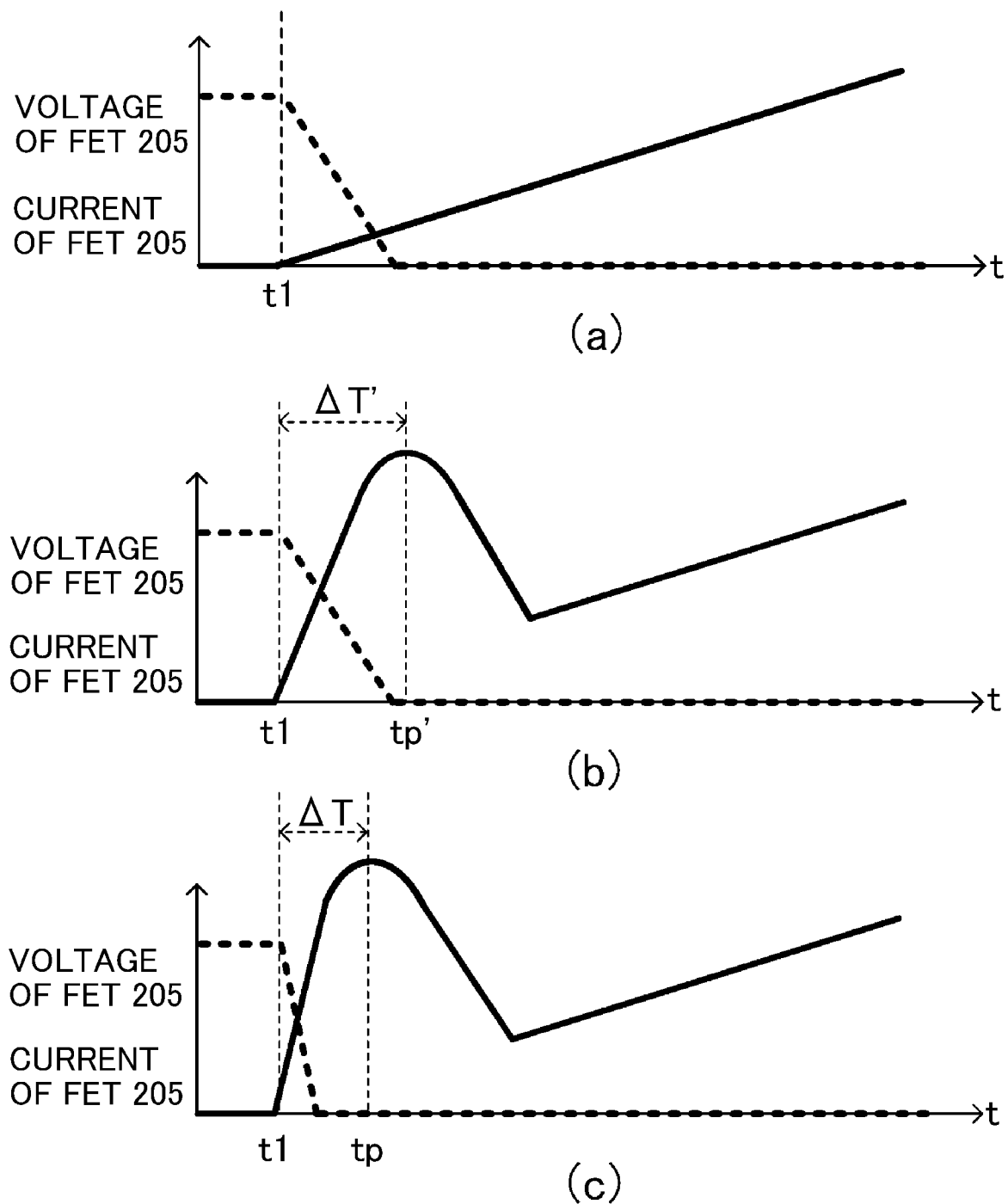
FIG. 4, part (a), part (b) and part (c), is a graph showing the turn-on waveforms of a FET in the power supply device according to the embodiment 1.

FIG. 4 shows the waveforms of FET 205 of the power supply device 108 according to the embodiment 1 during turn-on compared to the conventional configuration. The horizontal axes indicate time t, and "t1" indicates the same time as in FIG. 3. The dashed line shows the voltage at the drain terminal of FET 205, and the solid line shows the current flowing through FET 205. Part (a) of FIG. 4 shows the turn-on waveforms when the snubber circuit 310 with the auxiliary winding N3, the clamp capacitor 206, the diodes 207 and 208 of the transformer 204 is eliminated in the power supply configuration of the embodiment 1 shown in FIG. 2. In other words, it is the turn-on waveform of a typical flyback converter configuration. Since current flows to FET 205 only through the primary winding N1, the current flowing to FET 205 immediately after turn-on is small and increases as it approaches turn-off. Therefore, the electric power loss, which is the product of the voltage and current of FET 205, is less likely to occur during turn-on.

Generally, the speed of turn-on and turn-off switching operation of a switching FET (hereinafter referred to as "switching speed") is a trade-off between electric power loss and noise. In other words, the faster the speed of switching operation, the lower the electric power loss, and the slower the speed, the lower the high-frequency noise. Therefore, in general flyback converters, the switching speed is slowed down during turn-on, when electric power loss is less likely to occur, from the viewpoint of noise reduction. On the other hand, during turn-off, when the current flowing through the FETs is large, the electric power loss is reduced by increasing the switching speed. However, since high-frequency noise increases as the switching speed increases, the appropriate switching speed is determined by balancing the electric power loss and high-frequency noise generation.

Part (b) of FIG. 4 shows the turn-on waveform of the power supply configuration according to the embodiment 1 shown in FIG. 2. The power supply configuration with the snubber circuit 310 consisting of the auxiliary winding N3 of the transformer 204, the clamp capacitor 206, and the diode 207, as in the embodiment 1, is different from a typical flyback converter. That is, the energy stored in the clamp capacitor 206 flows to FET 205 as a current immediately after FET 205 turns on, as described above. Therefore, the peak value of the current flowing into FET 205 immediately after turn-on is as large as during turn-off. Depending on the settings of the transformer 204 and the clamp capacitor 206, it may be greatest immediately after turn-on. Therefore, during turn-on, the electric power loss in FET 205 is likely to occur as much as or more than during turn-off. Therefore, as shown in part (c) of FIG. 4, by increasing the turn-on speed, the electric power loss generated in FET 205 during turn-on can be reduced. In other words, the time from the time t1 when a high level signal is input to the gate terminal of FET 205 to the time when the current flowing to FET 205 due to the discharge current of the clamp capacitor 206 reaches its peak is shortened.

Specifically, the time ΔT from the time t1 in part (c) of FIG. 4 to the time tp, when the current flowing through FET 205 peaks, should be shorter than the time ΔT' from the time t1 in part (b) of FIG. 4 to the time tp', when the current flowing through FET 205 peaks. In the embodiment 1, in the gate drive circuit 300 composed of the diode 213, the resistor 214, and the resistor 215, the anode terminal of the diode 213 is connected to the DRV terminal side of the power supply IC212. The gate drive circuit 300 is configured so that the resistance value in the direction that current flows into the gate terminal of FET 205 is smaller ($R_{214} < R_{215}$) than the resistance value in the direction that current flows out from the gate terminal. This makes the turn-on speed faster than the turn-off speed in embodiment 1.

From the above, according to the embodiment 1, the turn-on speed is faster than the turn-off speed in a power supply configuration with a clamp circuit consisting of a clamping capacitor, two diodes, and the auxiliary winding of the transformer. This reduces the electric power loss during turn-on and reduces the generation of high-frequency noise during turn-off.

In the embodiment 1, the circuit that determines the speed of turn-on and turn-off is configured with the diode 213, the resistor 214, and the resistor 215, but it is not limited to this configuration. For example, as shown in part (b) of FIG. 2, a circuit in which a resistor is connected in serial to a parallel circuit of diode and resistor, or as shown in part (c) of FIG. 2, a circuit with only a parallel circuit of diode and resistor, or another circuit configuration may be used to realize the circuit.

Specifically, as shown in part (b) of FIG. 2, the diode 213 may have the anode terminal connected to the DRV terminal, the cathode terminal connected to one end of the resistor 214, and the resistor 214 connected to the gate terminal at the other end. The resistor 215 may then be connected to the DRV terminal at one end and to one end of the resistor 214 at the other end. As shown in part (c) of FIG. 2, the diode 213 may have its anode terminal connected to the DRV terminal and its cathode terminal connected to the gate terminal, and the resistor 215 may have one end connected to the DRV terminal and the other end connected to the gate terminal. In both cases, the gate drive circuit should have one or more resistors and diodes, and the anode terminal of the diode should be connected to the DRV terminal side of the power supply IC.

According to the above, the embodiment 1 can achieve both reduction of electric power loss and noise reduction in a power supply device.

Embodiment 2

[Power Supply Device]

The snubber circuit 310 of the embodiment 1, when applied to a power supply configuration with a power factor improvement function, is described in the embodiment 2. The description of the main parts is the same as that of the embodiment 1, and the same symbols are attached to the same configurations as those of the embodiment 1, and the description is omitted. Only the parts that differ from the embodiment 1 are described here.

Figure 5:
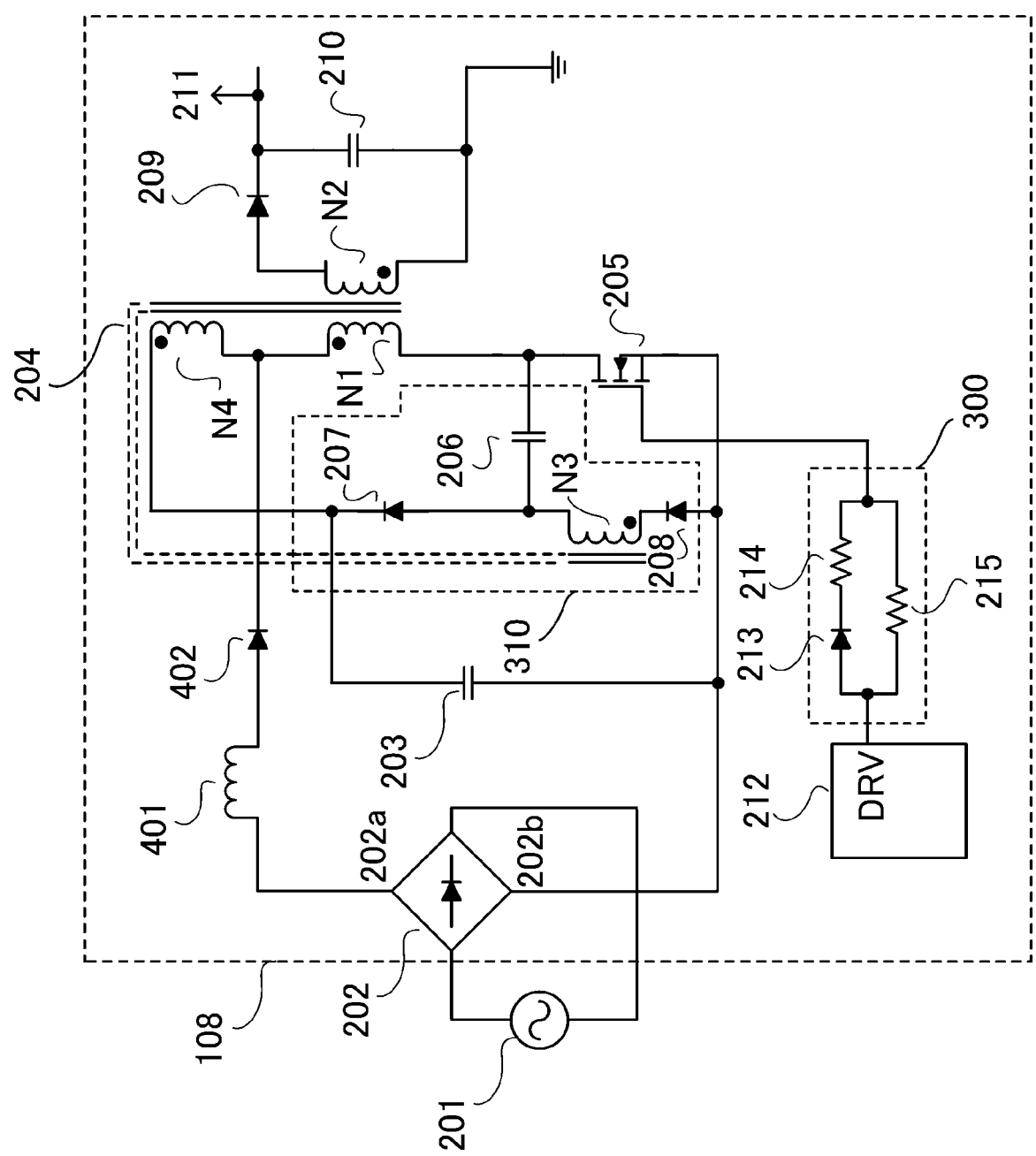
FIG. 5 is a drawing showing the circuit configuration of a power supply device according to the embodiment 2.

FIG. 5 shows the circuit structure of the power supply device 108 in the embodiment 2. In the power supply configuration of the embodiment 2, the output terminal 202a of the bridge diode 202 is connected to an inductor 401. The transformer 204 of the embodiment 2 has a first primary winding N1 (hereinafter simply referred to as primary winding N1) and a second primary winding N4 (hereinafter simply referred to as primary winding N4). The fourth rectifying element, diode 402, is connected on the anode side to the inductor 401 and on the cathode side to the connecting point between the divided primary winding N1 and the primary winding N4 of the transformer 204 (hereinafter referred to as intermediate tap). The cathode side of the primary filter capacitor 203 and diode 207 are connected to the other side of the primary winding N4. This power supply configuration improves the power factor compared to the power supply configuration of the embodiment 1. Other connections and functions are similar to those of the embodiment 1 and are omitted from the description.

[Switching Operation]

(When Turning on)

The switching operation of the embodiment 2 is described below. First, the operation when FET 205 turns on is explained. If the output voltage of the bridge diode 202 is higher than the voltage at the intermediate tap between the primary winding N1 and the primary winding N4 (hereinafter referred to as intermediate tap voltage), current flows through the inductor 401, the diode 402 and the primary winding N1 to FET 205. Along with this, energy is charged to the inductor 401. In addition, current flows from the primary filter capacitor 203 through the primary winding N4 to FET 205. If the output voltage of the bridge diode 202 is lower than the intermediate tap voltage, current flows from the primary smoothing capacitor 203 to FET 205 only through the primary winding N4.

(When Turning Off)

When FET 205 turns off, the energy charged in the inductor 401 at turn-on causes a charging current to flow through the inductor 401, the diode 402, and the primary winding N4 to the primary smoothing capacitor 203. In this configuration, the input current output from the AC power supply 201 does not directly charge the primary filter capacitor 203 via the bridge diode 202, but instead charges it when FET 205 is turned off. This results in a current waveform with improved power factor from a capacitor input type current waveform.

In the power supply configuration of the embodiment 2, the voltage applied to FET 205 is also higher than in the power supply configuration of the embodiment 1 because the inductor 401, the diode 402, and FET 205 form a boost circuit. Therefore, as in the embodiment 1, it is necessary to suppress the surge voltage at turn-off of FET 205 by a snubber circuit 310 composed of an auxiliary winding N3 of transformer 204, a clamp capacitor 206, a diode 207, and a diode 208. However, as in the embodiment 1, the energy stored in the clamp capacitor 206 flows as a current to FET 205 immediately after the turn-on of FET 205. Therefore, by increasing the turn-on speed, the electric power loss generated in FET 205 during turn-on can be reduced. Any of parts (a), (b), or (c) of FIG. 2 of the embodiment 1 may be applied to the configuration of the gate drive circuit 300.

From the above, according to the embodiment 2, the turn-on speed is faster than the turn-off speed even when the clamp circuit, which consists of a clamping capacitor, two diodes, and the transformer's auxiliary winding, is applied to a power supply configuration with a power factor correction function. This reduces the electric power loss during turn-on and prevents the generation of high-frequency noise during turn-off.

According to the above, the embodiment 2 can achieve both reduction of electric power loss and noise reduction in power supply devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A power supply device comprising:
 a transformer including a primary winding, a secondary winding and an auxiliary winding;
 a first circuit in which a first capacitor and a first rectifying element are connected in series, said first circuit being connected to said primary winding in parallel;
 a switching element of which one end is connected to one end of said primary winding and configured to be switched between an ON state and an OFF state;
 a second circuit in which said auxiliary winding and a second rectifying element are connected in series, said second circuit being connected between a connecting point, to which said first capacitor and said first rectifying element are connected, and the other end of said switching element;
 a control portion including a control terminal and configured to control the ON state and the OFF state of said switching element, and
 a third circuit including at least one resistor and a third rectifying element, and connected to a gate terminal of said switching element,
 wherein in a case in which said control portion turns on said switching element, a current flows from said control portion via said third circuit to said gate terminal of said switching element and a current flows from said first capacitor to said switching element,
 wherein in a case in which said control portion turns off said switching element, a current flows from said gate terminal of said switching element to said control portion via said third circuit, and
 wherein, in said third circuit, a resistance value in the case in which the current flows from said control portion via said third circuit to said gate terminal of said switching element is smaller than a resistance value in the case in which the current flows to said control portion via said third circuit out of said gate terminal of said switching element.

2. The power supply device according to claim 1,
 wherein said third circuit includes a first resistance and a second resistance of which a resistance value is greater than that of said first resistance,
 wherein said third rectifying element is a diode of which an anode terminal is connected to said control terminal and a cathode terminal is connected to one end of said first resistance, and
 wherein another end of said first resistance is connected to said gate terminal, and one end of said second resistance is connected to said control terminal and the other end is connected to said gate terminal.

3. The power supply device according to claim 1,
 wherein said third circuit includes a first resistance and a second resistance of which a resistance value is greater than that of said first resistance,
 wherein said third rectifying element is a diode of which an anode terminal is connected to said control terminal and a cathode terminal is connected to one end of said first resistance, and
 wherein one end of said first resistance is connected to said gate terminal, and one end of said second resistance is connected to said control terminal and the other end is connected to another end of said first resistor.

4. The power supply device according to claim 1,
 wherein said third circuit includes a second resistance,
 wherein said third rectifying element is a diode of which an anode terminal is connected to said control terminal and a cathode terminal is connected to said gate terminal, and
 wherein one end of said first resistance is connected to said gate terminal, and one end of said second resistance is connected to said control terminal and the other end is connected to another end of said first resistance.

5. The power supply device according to claim 1, further comprising a rectifying circuit including two output terminals and configured to rectify an AC voltage, and
 a second capacitor connected between said two output terminals in parallel,
 wherein said two output terminals of said rectifying circuit are connected in parallel to a serial circuit in which said primary winding and said switching element are connected in series.

6. The power supply device according to claim 1, further comprising a rectifying circuit including two output terminals and configured to rectify an AC voltage,
 an inductor of which one end is connected to said rectifying circuit and the other end is connected to a fourth rectifying element, and
 a second capacitor connected in parallel to a serial circuit in which said primary winding and said switching element are connected in serial,
 wherein said fourth rectifying element is a diode of which an anode terminal is connected to said inductor and a cathode terminal is connected to an intermediate tap of said primary winding.

7. An image forming apparatus comprising:
 an image forming unit configured to form an image onto a recording material;
 a power supply device configured to supply electric power to said image forming unit, said power supply device including,
 a transformer including a primary winding, a secondary winding and an auxiliary winding;

a first circuit in which a first capacitor and a first rectifying element are connected in series, said first circuit being connected to said primary winding in parallel;

a switching element of which one end is connected to one end of said primary winding and configured to be switched between an ON state and an OFF state;

a second circuit in which said auxiliary winding and a second rectifying element are connected in series, said second circuit being connected between a connecting point, to which said first capacitor and said first rectifying element are connected, and the other end of said switching element;

a control portion including a control terminal and configured to control the ON state and the OFF state of said switching element, and a third circuit including at least one resistor and a third rectifying element, and connected to a gate terminal of said switching element, wherein in a case in which said control portion turns on said switching element, a current flows from said control portion via said third circuit to said gate terminal of said switching element and a current flows from said first capacitor to said switching element, wherein in a case in which said control portion turns off said switching element, a current flows from said gate terminal of said switching element to said control portion via said third circuit, and wherein, in said third circuit, a resistance value in the case in which the current flows from said control portion via said third circuit to said gate terminal of said switching element is smaller than a resistance value in the case in which the current flows to said control portion via said third circuit out of said gate terminal of said switching element.

8. The image forming apparatus according to claim 7, wherein said third circuit includes a first resistance and a second resistance of which a resistance value is greater than that of said first resistance, wherein said third rectifying element is a diode of which an anode terminal is connected to said control terminal and a cathode terminal is connected to one end of said first resistance, and wherein another end of said first resistance is connected to said gate terminal, and one end of said second resistance is connected to said control terminal and the other end is connected to said gate terminal.

9. The image forming apparatus according to claim 7, wherein said third circuit includes a first resistance and a second resistance of which a resistance value is greater than that of said first resistance, wherein said third rectifying element is a diode of which an anode terminal is connected to said control terminal and a cathode terminal is connected to one end of said first resistance, and wherein another end of said first resistance is connected to said gate terminal, and one end of said second resistance is connected to said control terminal and the other end is connected to one end of said first resistor.

10. The image forming apparatus according to claim 7, wherein said third circuit includes a second resistance, wherein said third rectifying element is a diode of which an anode terminal is connected to said control terminal and a cathode terminal is connected to said gate terminal, and wherein one end of said first resistance is connected to said gate terminal, and one end of said second resistance is connected to said control terminal and the other end is connected to another end of said first resistance.

11. The image forming apparatus according to claim 7, further comprising a rectifying circuit including two output terminals and configured to rectify an AC voltage, and a second capacitor connected between said two output terminals in parallel, wherein said two output terminals of said rectifying circuit are connected in parallel to a serial circuit in which said primary winding and said switching element are connected in series.

12. The image forming apparatus according to claim 7, further comprising a rectifying circuit including two output terminals and configured to rectify an AC voltage, an inductor of which one end is connected to said rectifying circuit and the other end is connected to a fourth rectifying element, and a second capacitor connected in parallel to a serial circuit in which said primary winding and said switching element are connected in serial, wherein said fourth rectifying element is a diode of which an anode terminal is connected to said inductor and a cathode terminal is connected to an intermediate tap of said primary winding.

* * * * *